US007839964B2

(12) United States Patent
Campiche et al.

(10) Patent No.: US 7,839,964 B2
(45) Date of Patent: Nov. 23, 2010

(54) BIT PATTERN SYNCHRONIZATION IN ACQUIRED WAVEFORMS

(75) Inventors: Thierry Campiche, Geneva (CH); Martin Miller, Chester, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 752 days.

(21) Appl. No.: 11/824,214

(22) Filed: Jun. 29, 2007

(65) Prior Publication Data
US 2009/0003502 A1    Jan. 1, 2009

(51) Int. Cl.
H04L 7/00    (2006.01)
(52) U.S. Cl. .......................................... 375/355; 341/51
(58) Field of Classification Search ................. 327/271; 341/51, 123; 375/320, 333, 350, 361
See application file for complete search history.

(56) References Cited
U.S. PATENT DOCUMENTS
6,271,773 B1 * 8/2001 Kobayashi .................... 341/51
6,374,388 B1   4/2002 Hinch
7,450,666 B2 * 11/2008 Miyanaga et al. ........... 375/333
2006/0177018 A1   8/2006 Kobayashi et al.
2007/0268162 A1 * 11/2007 Viss et al. ...................... 341/51

* cited by examiner

Primary Examiner—David C Payne
Assistant Examiner—Leon-Viet Q Nguyen
(74) Attorney, Agent, or Firm—Gordon Kessler

(57) ABSTRACT

A waveform processing system performs operations that may include identifying a location of a specified bit pattern within a coherently sampled repeating pattern input signal. In some examples, multiple periods of a repeating pattern signal are acquired using coherent sampling techniques such as, for example, coherent interleaved sampling (CIS). In such examples, the sampled waveform may be converted to a binary pattern that can be searched to locate a match to a predetermined or user-specified bit pattern. In one illustrative example, the identified location may be used to display the sampled waveform. In another example, the identified location may be used to measure pattern-dependent jitter of the sampled waveform.

14 Claims, 7 Drawing Sheets

BIT PATTERN SYNCHRONIZATION IN ACQUIRED WAVEFORMS

TECHNICAL FIELD

Various embodiments relate to processing of waveform data acquired by sampling.

BACKGROUND

Data rates continue to increase in digital systems, communication systems, computer systems, and in other applications. In such applications, various devices may communicate by sending or receiving signals that are encoded with information in the form of signal levels (e.g., amplitude) in certain intervals of time. Proper decoding of periodic signals, for example, may involve measuring the signal level in the correct time interval, or period. As data rates increase, margins of error in the signal level timing tend to decrease, and the problem of accurately accounting for various imperfections in the data signal quality becomes more and more important.

In some communication systems, data can be formatted as a sequence of NRZ bits. Applications such as spread-spectrum communications, security, encryption and modems sometimes require the generation of bit sequences. In various applications, a specific bit sequence may serve as a test signal, for example. In some cases, a particular bit sequence may be repeated multiple times. One type of repeating bit sequence is a pseudo-random binary sequence (PRBS). Pseudorandom binary sequences are well known in the art and can be generated using linear feedback shift registers (LFSR). Sequences generated by an LFSR are actually "pseudo" random because the generated sequence is completely deterministic and repeats, and so is not truly random.

A digital oscilloscope (DO) is a tool that engineers can use to acquire and view signal waveforms from electronic circuitry. As signals get ever faster, it is beneficial to have DOs capable of digitizing these faster signals. The capability of a DO to digitize fast signals is generally a function of its effective bandwidth and effective sample rate. The sample rate is typically the number of samples points taken of a waveform acquired per unit time, and is equal to the reciprocal of the sample period, or the time between samples.

Various techniques have been developed for a DO to acquire waveforms. One such method is referred to as single shot mode. In single shot mode, a DO begins sampling a waveform event in real time when a trigger condition is satisfied. Such single shot acquisition is generally limited by the effective sampling rate of the analog-to-digital conversion, and the length of time over which an event may be sampled is limited by the size of the acquisition memory that receives the output from the converter.

Other methods for a DO to acquire waveforms may be referred to as random interleave sampling (RIS) or equivalent time (ET) sampling. In such modes of operation, a DO repeatedly samples a recurring event at different points (delays relative to a trigger event) in the event. A single composite representation of the event is then compiled from each of the samples. In order to reduce the probability of aliasing, the time between detection of the trigger condition and the sampling may be randomized between samples. An alternative method of equivalent time sampling is called coherent interleaved sampling, in which there is no trigger for each event; but rather a process of regular synchronized sampling at progressively advancing (or preceding) phase in the repeating pattern such that a composite acquisition can be formed of a similar nature to traditional equivalent time sampling techniques (see U.S. patent application Ser. No. 11/346,854, titled COHERENT INTERLEAVED SAMPLING, filed Feb. 3, 2006, currently pending, the contents thereof being incorporated herein by reference.

SUMMARY

A waveform processing system performs operations that may include identifying a location of a specified bit pattern within a coherently sampled repeating pattern input signal. In some examples, multiple periods of a repeating pattern signal are acquired using coherent sampling techniques such as, for example, coherent interleaved sampling (CIS). In such examples, the sampled waveform may be converted to a binary pattern that can be searched to locate a match to a predetermined or user-specified bit pattern. In one illustrative example, the identified location may be used to trigger display of the sampled waveform. In another example, the identified location may be used to measure pattern-dependent jitter of the sampled waveform.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION OF ILLUSTRATIVE EXAMPLES

Figure 1:
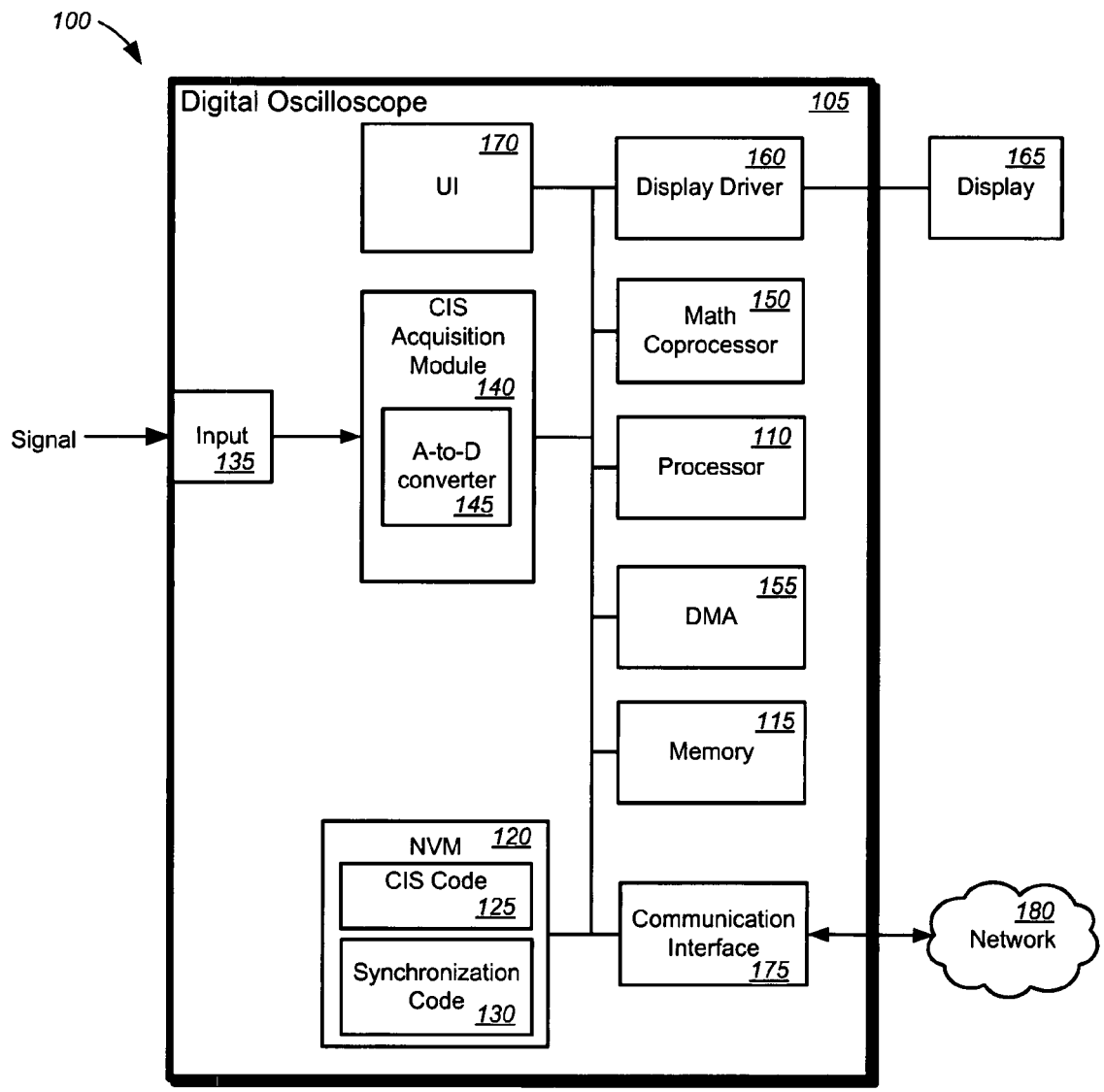
FIG. 1 shows an exemplary waveform processing system to acquire high speed signals using coherent sampling methods.

FIG. 1 shows an exemplary waveform processing system 100 capable of acquiring high speed, repetitive digital waveforms using coherent sampling methods, such as coherent interleaved sampling (CIS), and displaying portions of the acquired waveforms relative to a specified bit sequence. The waveform processing system 100 includes a digital oscilloscope (DO) 105 for acquiring, storing, and processing at least one input signal with a repetitive waveform. The DO 105 includes a processor 110 to execute instructions stored in a memory 115, and/or a non-volatile memory (NVM) 120. In the depicted example, the NVM 120 includes a CIS code 125 and a synchronization code 130. The processor 110 executes the synchronization code 130 to determine a synchronizing location of a user-specified bit sequence in the acquired waveform. In some examples, the processor 110 can store the synchronizing location in various data storage devices for further processing. For example, the processor 110 may retrieve the synchronizing location to display portion of the acquired waveform based on user-specified parameters.

In this example, the DO 105 receives the input signal through an input interface 135. For example, the input interface 135 may be a connector, an antenna, a signal detector, or a photo receiver for receiving the input signal. In some embodiments, the input signal may be sensed by an active or passive probe. For example, the probe can be coupled to a transmission line, or other signal transmission medium to receive the input signal. In various applications, the input signal may originate from a signal generator, analog and/or digital circuitry, transceivers (e.g., modem), wired or wireless or fiber optic communication equipments, or other transmission equipment.

The DO 105 includes a CIS acquisition module 140 to acquire a repetitive waveform in the input signal. In this example, the input interface 135 sends the received input signal to the CIS acquisition module 140 for processing. The acquisition module 140 may sample a repetitive waveform in the input signal 110 using CIS techniques. In various examples, the CIS acquisition module 140 samples multiple complete patterns of the repetitive waveform. In various implementations, the pattern length of the waveform may be, but is not limited to, between about 10 and at least about $2^{23}$ bits long, although an arbitrary length may be accommodated subject to any data storage and/or acquisition time constraints. In various implementations, the number of complete patterns that may be acquired in CIS mode may include, but is not limited to, between about 1 and at least about 1,000,000 full patterns, although an arbitrary number of patterns may be accommodated subject to any data storage and/or acquisition time constraints.

In some embodiments, the acquisition module 140 can acquire the repetitive waveform using a sampling frequency less than the Nyquist frequency of a bit rate of the input signal. For example, the acquisition module 140 may take numerous samples of each bit in a 64-bit long repeating pattern, and repeatedly acquire samples from the 64-bit pattern for several thousand cycles of the pattern.

In some embodiments, the CIS acquisition module 140 generates sampling strobes to sample the repetitive waveform uniformly. For example, the acquisition module 140 may generate the sampling strobes such that a sampling period is a relatively prime integer for both a clock period (e.g., a reciprocal of the bit rate) of the input signal and a period of the repetitive waveform. In some embodiments, the acquisition module 140 may include a phase lock loop (PLL) circuit to generate the sampling strobes. Some exemplary methods and systems for generating the sampling period and the sampling strobes are described in U.S. Patent Publication 2006/0177018.

The CIS acquisition module 140 includes an Analog-to-Digital converter (ADC) 145 to convert the analog input signal into a digital representation of the signal for processing and storage. For example, the ADC 145 may output a digital representation of input signal amplitude at each sample time. Using the digital representation of the signal, the CIS acquisition module 140 can reconstruct a digital representation of the acquired repetitive waveform. For example, the acquisition module 140 can combine multiple periods of the sampled waveform into a single period of the waveform. Next, the processor 110 can store the acquired waveform in the memory 115 and/or the NVM 120. In some examples, the processor 110 can execute the synchronization code 130 to synchronize the acquired waveform to the synchronizing location before storing the acquired waveform. In some examples, the acquired waveform can be stored by having the synchronizing location as the beginning of the waveform.

The DO 105 includes a math coprocessor 150 to supplement functions performed by the processor 110. For example, the math coprocessor 150 may include one or more of the following: an ASIC (application specific integrated circuit), a DSP (digital signal processor), discrete or integrated analog and/or digital circuits, and dedicated digital logic architecture to perform math functions, for example. The math coprocessor 150 may cooperate with the processor 110 to perform various functions. For example, the math coprocessor 150 may perform operations that include floating point arithmetic, signal processing, digital filtering (e.g., IIR, FIR) and/or numerical operations (e.g., curve fitting, numerical derivative computation, numerical integration, fast Fourier transformation (FFT), and interpolation). In some embodiments, the functions of the processors 110, 150 may be performed by a single processor or by multiple processors.

In some embodiments, the math coprocessor 150 can perform functions for executing the synchronization code 130. For example, the math coprocessor 150 may perform some or all operations of a bit sequence matching method to determine the synchronizing location in the acquired waveform. In some embodiments, the math coprocessor 150 may include specialized features to perform the matching method efficiently. For example, the math coprocessor 150 may include features to convert a digitally represented waveform into a binary bit sequence. The math coprocessor 150 may include an ASIC for converting the waveform into a binary bit sequence such that the conversion can be done faster and use less memory space. The processor 110 can search the converted binary sequence to determine whether it contains a user-specified bit sequence.

In the depicted example, the processor 110 is coupled through a digital bus to the memory 115 and the NVM 120, and a Direct Memory Access (DMA) controller 155. The NVM 120 may provide a data store for storing data (e.g., waveform data acquired by the CIS acquisition module 140) and/or executable instructions (e.g., the CIS code 125, the synchronization code 130). The NVM 120 may include, for example, a flash memory, a read only memory (ROM), EEPROM, data storage devices with rotating media (e.g., optical or magnetic disc drive), tape storage devices, or any combination of such devices. In this example, the NVM 120 includes the CIS code 125 to instruct the processor 110 to acquire a signal with a repetitive waveform using a CIS technique. The processor 110 may also store the acquired waveform in the memory 115 or the NVM 120.

In some embodiments, the memory 115 may provide volatile data storage for scratch pad memory and/or for the sampled signal data from the CIS acquisition module 140. The memory 115 may be, for example, a RAM (random access memory), a buffer, or a cache memory.

In some embodiments, the memory 115 may also store intermediate results produced by the processor 110 and/or the math coprocessor 150. For example, the memory 115 may store the converted binary bit sequence of the acquired waveform. The processor 110 may then retrieve the stored bit sequence when the processor 110 compares the converted binary bit sequence to the desired bit sequence. In another example, the memory 115 may also store locations and bit patterns of some partially matched bit sequences. In another example, the memory 115 may store the synchronizing location to synchronize the acquired waveform.

The DMA controller 155 may handle accesses of the memory 115 without direct involvement of the processors 110, 150. For example, the DMA controller 155 can move data from one memory location to another memory location without direct involvement of the processors 110, 150. In another example, the DMA controller 155 may be configured to move samples of the sampled input signal from the CIS acquisition module 140 directly into sequential memory locations, such as an array in the memory 115 and/or the NVM 120, for subsequent processing.

Based on the synchronizing location, the DMA controller 155 may rearrange data that represents the acquired waveform. For example, the DMA controller 155 can arrange the data such that the synchronizing location in the waveform is at the lowest memory address or at the beginning of the stored waveform. In another example, the DMA controller 155 can rearrange the data representing the acquired waveform to be stored in a storage device.

The DO 105 also includes a display driver 160 coupled to a display 165 for displaying output, such as the acquired waveform. For example, the DO 105 can use the display driver 160 and the display 165 to show a portion of the acquired waveform. Based on the synchronizing location, the processor 110 can use the display driver 160 to display a portion of the acquired waveform containing the desired bit sequence.

As an illustrative example, a repetitive waveform acquired by CIS can be searched to locate the desired bit pattern. Using the identified location, a portion of the waveform that includes the specified bit sequence may be sent to the display driver 160 for display. In some embodiments, the portion of the waveform sent for display may start at a user-specified offset from the identified location.

In this example, the DO 105 uses a user interface (UI) 170 and a communication interface 175 to receive input. For example, the UI 170 may include a keyboard, a touch screen, a keypad, or other user input devices. An operator of the DO 105 can use the UI 170 to input parameters for CIS acquisition, such as a bit rate of the input signal and a pattern length of the waveform. In another example, the operator can also specify the desired bit sequence for matching via the UI 170. In some embodiments, the UI 170 may include a synchronization activation button in its control menu. The user can choose to activate the synchronization code 130 by activating, for example, a checkbox and selecting the desired bit sequence to which the display should be synchronized. In some examples, the processor 110 may then execute the synchronization code 130 to identify the synchronization location in the acquired waveform.

In some implementations, the operator can also specify other search parameters for identifying the synchronizing location. Some exemplary search parameters are described with reference to FIG. 6. Using the user-specified desired bit sequence, the processor 110 can search for the synchronizing location in the acquired waveform matching the specified bit sequence.

The communication interface 175 may communicate with external devices via a network 180. Through the network 180 and the communication interface 175, the DO 105 may receive CIS measurement parameters (e.g., a bit rate and a pattern length). Commands and parameters for the DO 105 can also be received via the network 180. For example, a remote computing device can send a start acquisition command to invoke a CIS acquisition operation in the DO 105 via the network 180. In another example, the remote computing device can also instruct the DO 105 to identify a synchronizing location in the acquired waveform by sending a synchronize command and a desired bit sequence using the network 180. In some examples, the communication interface 175 may use a packet transfer protocol over the network 180. The network 180 may send or receive signals over pathways that may include the Internet, a LAN (local area network), a WAN (wide area network), or a MAN (metropolitan area network). In various examples, the network 180 may include wireless and/or optical networks, and other wired network to communicate to the DO 105.

The DO 105 can also transmit raw sample data, intermediate processed data, final processed data, and/or configuration parameters (e.g., data rate, digital filters, and the like) to the remote computing device using the network 180 and the communication interface 175. For example, the DO 105 can transmit all or a portion of an acquired CIS waveform to the remote computing device via the network 180 and the communication interface 175. In another example, the DO 105 can transmit a user-specified portion of the acquired CIS waveform starting at, for example, an identified synchronizing location in the waveform.

Figure 2:
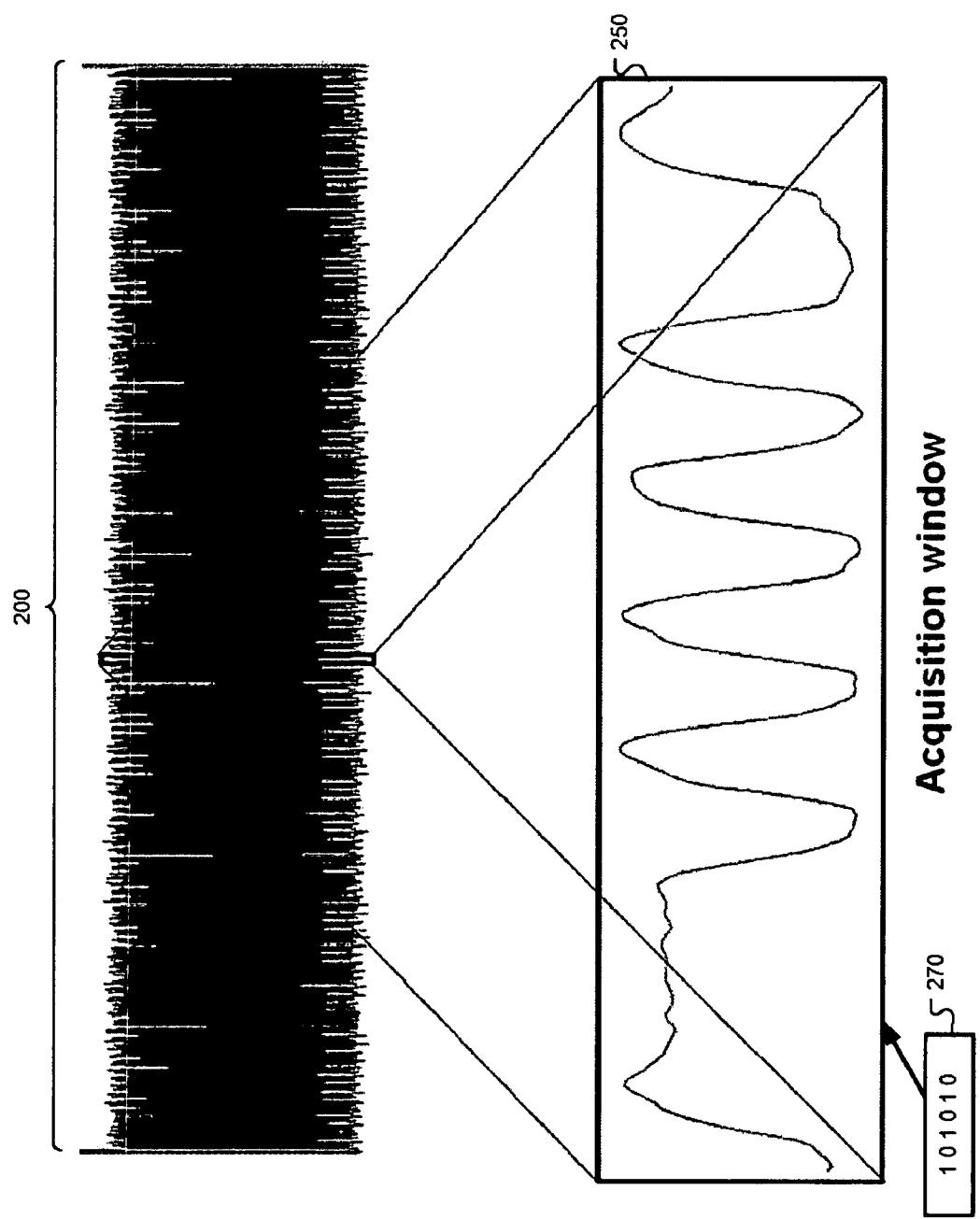
FIG. 2 shows an exemplary waveform acquired by coherent sampling, and an exemplary acquisition window of the waveform.

FIG. 2 shows an example of a full pattern of a repetitive waveform 200 acquired using CIS. For example, the processor 110 can acquire the waveform 200 using the CIS acquisition module 140 by sampling multiple periods of the waveform 200 and combining the sampled periods into a full pattern of the waveform 200. The waveform 200 can be converted to a digital representation and stored in a data storage device, such as the memory 115. In some examples, a synchronizing location can be identified in the waveform 200 using a desired bit sequence. Using the synchronizing location, the processor 110 may perform further processing (e.g., jitter analysis, noise analysis, waveform analysis, and/or other transmission performance analysis) beginning at the synchronizing location.

As shown in FIG. 2, an acquisition window 250 displays a portion of the entire waveform 200. In some examples, the processor 110 may receive, from the user, a bit rate and a pattern length of the repetitive waveform 200 to be acquired. The CIS acquisition module 140 can acquire the waveform 200 and use the ADC 145 to obtain a digital representation of the waveform 200.

Upon receiving a synchronize command and a desired bit sequence, the processor 110 may attempt to identify a synchronizing location in the waveform 200 that matches the desired bit sequence. In some embodiments, the processor 110 can retrieve the desired bit sequence from the memory 115 or the NVM 120. For example, the synchronization code 130 may specify a memory location that contains the desired bit sequence. In some embodiments, the processor 110 can receive the desired bit sequence from the UI 170 or the communication interface 175. For example, the synchronization code 130 may include operations to fetch the desired bit sequence from the UI 170 or the communication interface 175.

In some embodiments, the processor 110 or the math coprocessor 150 can convert a digitally represented waveform into a binary bit sequence. For example, the processor 110 may use a threshold (e.g., one or more voltage levels) to determine whether a bit in the waveform 200 is logic 1 or logic 0. For each bit in the waveform 200, the processor 110 can compare the digitally represented amplitude of the bit to the one or more thresholds. In some embodiments, digital filtering may be employed. Based on the comparison results, the processor 110 can convert the bits of the waveform 200 into a binary bit sequence, containing binary values of 1 and 0. After converting at least a portion of the waveform 200 into a binary bit sequence, the processor 110 may search the sequence for a match to the specified bit sequence.

For example, the processor 110 may check, starting from a leftmost position in the converted binary bit sequence, whether an occurrence of the desired bit sequence is present at a selected location. The search may include an attempt to match the specified bit sequence to a sequence at the selected location.

If the desired bit sequence is not present, then the processor 110 selects an adjacent location of the selected position and repeats the check at the newly selected position.

In some embodiments, the search may be performed by selecting portions of the converted binary bit pattern, and comparing each selected portion to the specified bit sequence. If no match is found, then the next portion of the waveform to be selected is separated from the previous selected portion by up to m bits, where m is the length (in bits) of the specified bit sequence. Such a search procedure may be repeated until a match is found. Accordingly, the search procedure may require the processor 110 to convert fewer bit values to search the entire waveform, resulting in faster execution and/or saving in computation power. In some examples, such a search procedure may be used, for example, when the bit length (m) is greater than a threshold bit length.

In another example, the processor 110 may use the stored information to determine an offset from the current position. Using the determined offset, the processor 110 may select a new position to match the desired bit sequence. For example, the processor 110 may identify a longest suffix of a bit sequence starting at the current position that matches a prefix of the desired bit sequence. Then, the processor 110 may shift right to the position at the beginning of the identified suffix. In other examples, other bit matching methods, such as methods based on the Boyer-Moore algorithm, or the Karp-Rabin algorithm, may also be used.

In some embodiments, the desired bit sequence may include one or more "don't care" values. For example, the user may specify in the desired bit sequence that some bit values in the sequence are to be ignored during comparisons. In some examples, the processor 110 can match the desired bit sequence to the waveform without comparing the "don't care" values in the desired bit sequence. For example, the user may specify a desire bit sequence as [0 1 ×1]. Then, the processor 110 may determine that bit sequences of [0 1 1 1] and [0 1 0 1] are both matching bit sequences to the desired bit sequence.

The acquisition window 250 shows a portion of the waveform 200. In this example, a waveform in the acquisition window 250 may be converted into binary bit sequence of [0 1 1 1 0 1 0 1 0 1 0 0 1]. As an illustrative example, the user may specify a desired bit sequence 270 that includes the binary bit sequence [1 0 1 0 1 0]. Using the desired bit sequence 270, the processor 110 may identify the fourth location in the acquisition window 250 as the synchronizing location.

Figure 3:
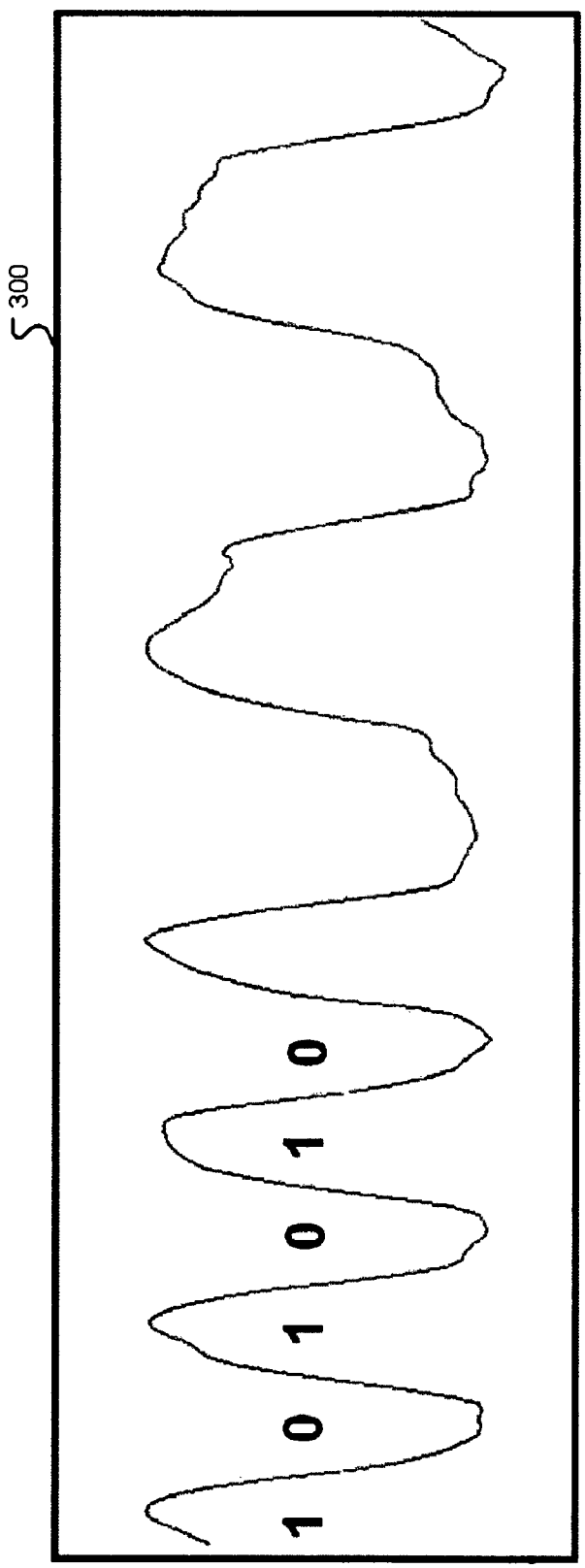
FIG. 3 shows an exemplary acquisition window synchronized to a desired bit sequence.

FIG. 3 shows an exemplary acquisition window 300 synchronized to the desired bit sequence 270 (FIG. 2). For example, the processor 110 may identify the synchronizing location in the waveform 200, and display (e.g., on the display device 165) a portion of the waveform 200 aligned at the identified synchronizing location.

Figure 4:
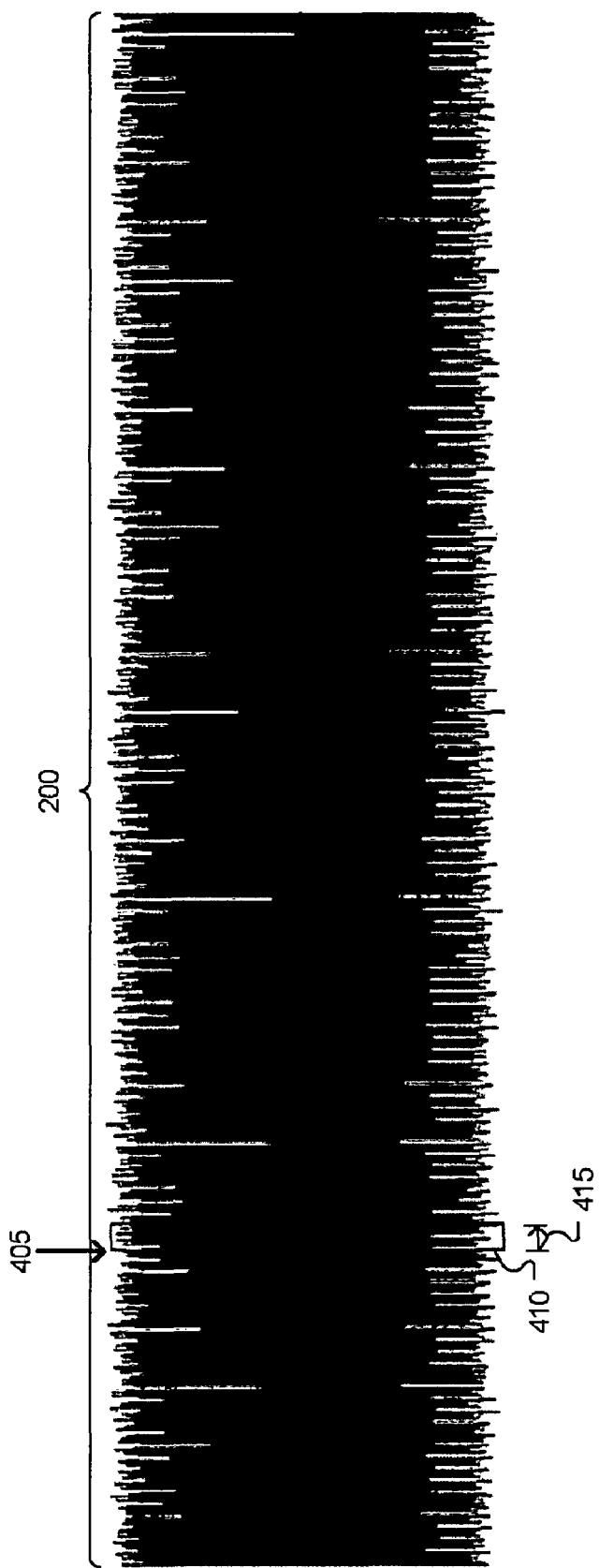
FIG. 4 is an example showing the waveform of FIG. 2 having an identified location of the desired bit sequence of FIG. 3.

FIG. 4 is an example showing the waveform 200 of FIG. 2 having an identified synchronizing location 405 in the waveform 200. The location 405 may be stored in a data storage device (e.g., the memory 115 and/or the NVM 120). For example, the processor 110 can retrieve the location 405 and the waveform 200 from the memory 115 to perform analysis on the waveform at any location relative to the synchronized location 405. For example, the processor 110 may use the synchronized location 405 to identify a waveform portion 410 starting at the synchronized location 405 with a pattern length 415 to be analyzed.

Figure 5:
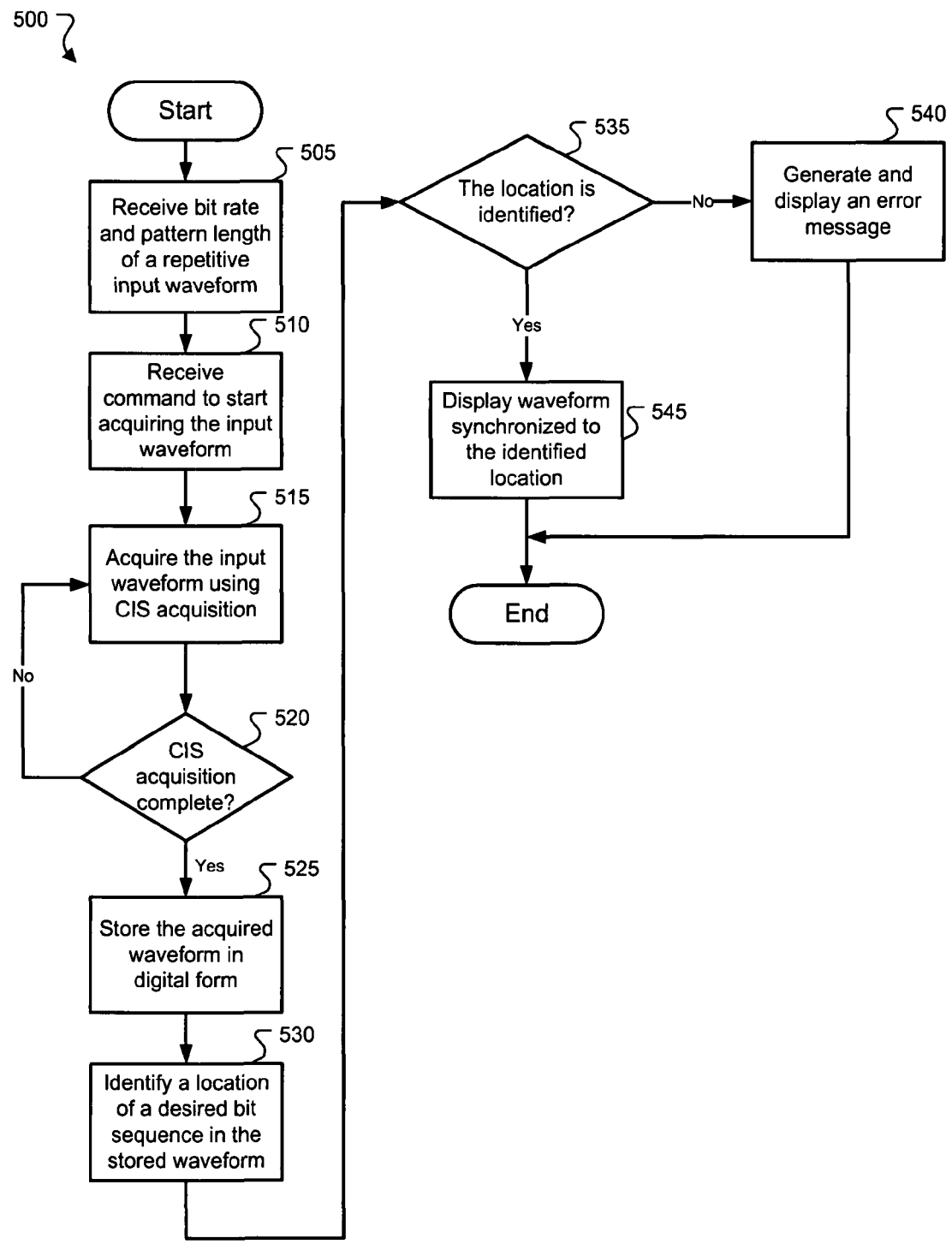
FIG. 5 shows an exemplary method for displaying a coherently acquired waveform synchronized to the desired bit sequence.

FIG. 5 shows an exemplary method 500 for displaying a CIS acquired waveform synchronized to a desired bit sequence (e.g., the bit sequence 270 in FIG. 2). The method 500 includes operations that may be performed generally by the DO 105.

The operations may be performed under the control, supervision, and/or monitoring of the processor 110. Operations may also be supplemented or augmented by other processing and/or control elements that may be incorporated by the communication interface 175. Some or all of the operations may be performed by one or more processors executing instructions tangibly embodied in a signal. The processing may be implemented using analog and/or digital hardware or techniques, either alone or in cooperation with one or more processors executing instructions.

The method 500 begins in step 505 when a bit rate and a pattern length of a repetitive input waveform are received. For example, a user of the DO 105 may provide the bit rate and the pattern length information to the DO 105 using the UI 170. In another example, the processor 110 may use the communication interface 175 to receive the bit rate and the pattern length. In another example, the processor 110 may execute the CIS code 125 that may specify the bit rate and the pattern length of the waveform. Next, a command is received, in step 510, to start acquiring the input waveform. In step 515, the input waveform is acquired using the CIS acquisition. For example, the processor 110 can execute the CIS code 125 to acquire the input waveform after receiving a command to acquire the input waveform.

It is determined whether the CIS acquisition is completed in step 520. For example, the processor 110 may check a status register in the CIS acquisition module 140 to determine whether the CIS acquisition is completed. If the CIS acquisition is not completed, then the step 515 is repeated. If the CIS acquisition is completed, then the acquired waveform is stored in digital form in step 525. For example, the processor 110 can store the acquired waveform in digital form in the memory 115.

Next, a location of the desired bit sequence is, in step 530, identified in the stored waveform. Some example methods on identifying the synchronizing location are described with reference to FIGS. 6-7. In step 535, it is determined whether the location is identified. For example, the processor 110 may check an output of the step 530 to determine whether the location is identified. If the location is not identified, then an error message is generated and displayed in step 540 and the method 500 ends. In another example, the error message can be transmitted to a remote computing device via the network 180. In another example, the error message can be saved in the memory 115. If the location is identified, then a portion of the waveform is synchronized to the identified location and displayed in step 545 and the method 500 ends.

In some embodiments, the synchronized location can also be saved in a data storage device for further processing. For example, the synchronized location may then be transmitted along with the acquired waveform to the remote computing device via the network 180. In another example, the synchronized location and the acquired waveform can be stored in a removable storage medium (e.g., a DVD-ROM, a CD-ROM, etc.). The stored data can then be transported and analyzed in another computing system.

Figure 6:
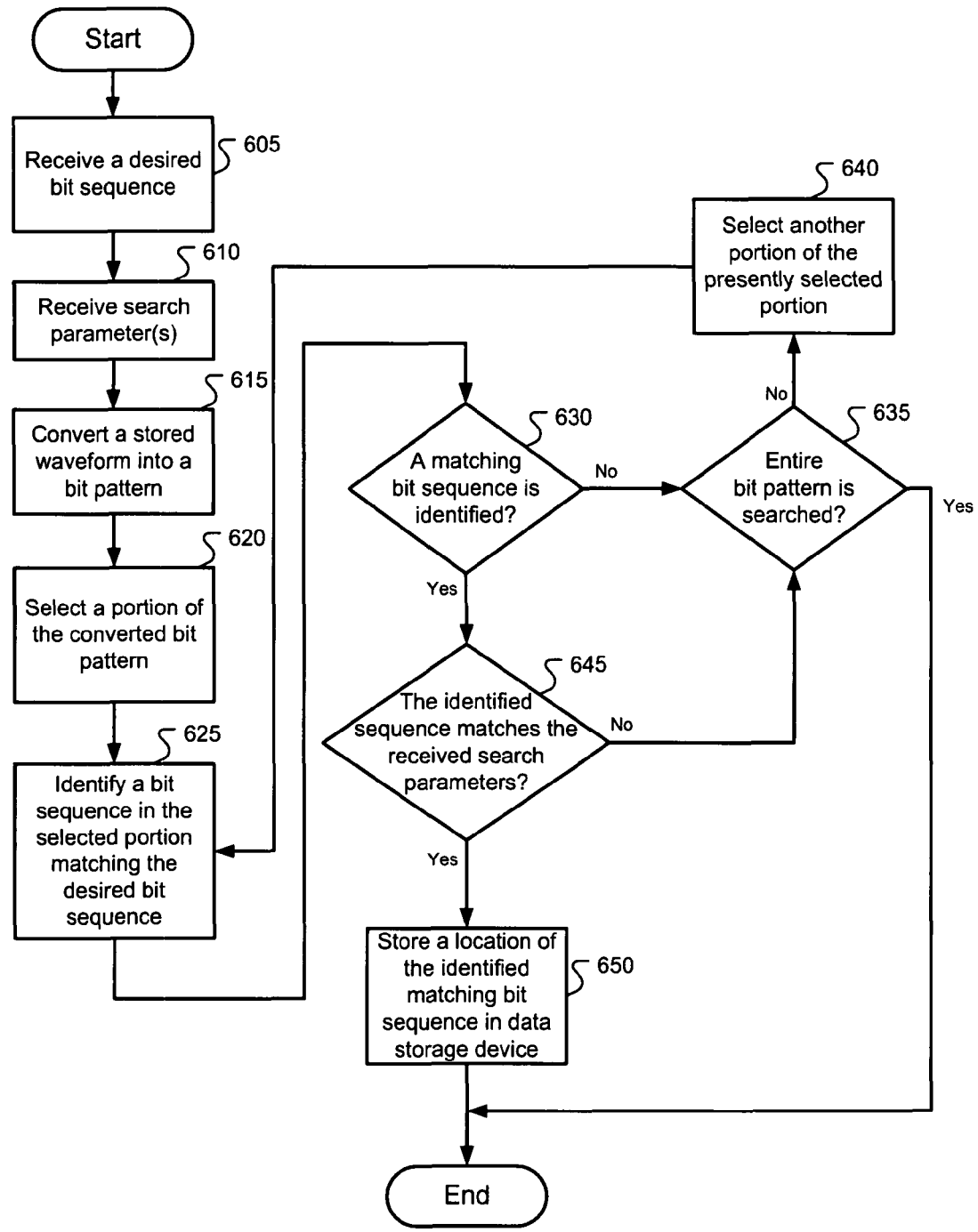
FIGS. 6-7 show exemplary methods for identifying a location of the desired bit sequence in a coherently acquired waveform.
Figure 7:
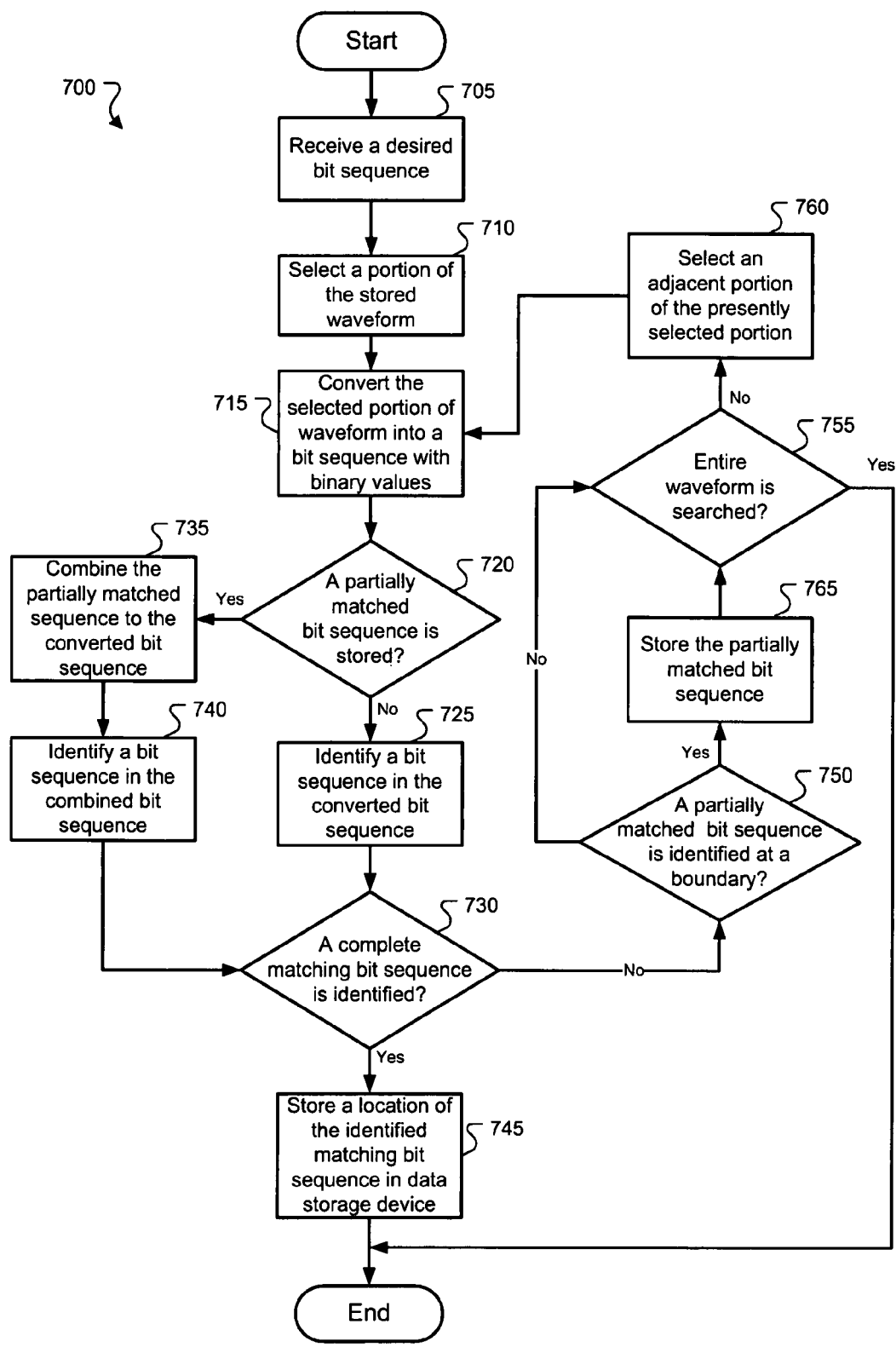

FIGS. 6-7 show exemplary methods 600, 700 for identifying a location of a desired bit sequence in a CIS acquired waveform. For example, the processor 110 may execute the method 600 or 700 when the processor 110 is executing the step 530 in the method 500 (FIG. 5). In some examples, the synchronization code 130 may include some or all operations or steps described with reference to FIGS. 6-7. As shown in FIG. 6, the method 600 begins in step 605 when a desired bit sequence is received. For example, the processor 110 can receive the desired bit sequence from the memory 115, the NVM 120, a user input via the UI 170, or the network 180 using the communication interface 175.

Next, search parameters are received in step 610. In some embodiments, the synchronization code 130 may incorporate various search parameters to identify the synchronizing location. For example, the synchronization code 130 may incorporate a search parameter, N, to identify the Nth occurrence of the desired bit sequence in the waveform. In some embodiments, the synchronization code 130 may incorporate a search parameter that is a second bit sequence. Using the second bit sequence, the processor 110 may search for a synchronizing location that includes the desired bit sequence, for example, before or after an occurrence of the second bit sequence. In another example, the synchronization code 130 may incorporate additional search parameters that may include an offset to specify a minimum offset between the identified location of the second bit sequence and the synchronizing location. In some embodiments, a combination of the above search parameters and/or other search parameters may be used.

In step 615, a stored waveform is converted into a bit pattern after the search parameters are received. For example, the processor 110 can convert a digitally represented waveform into a bit sequence containing binary values. Next, a portion of the converted bit pattern is selected in step 620. A bit sequence in the selected portion is, in step 625, identified to match the desired bit sequence.

It is determined whether a matching bit sequence is identified in step 630. For example, the matching bit sequence is a bit sequence in the converted bit pattern. If the matching bit sequence is not identified, then it is determined in step 635 whether an entire bit pattern is searched. If the entire bit pattern is searched, then the method 600 ends. If the bit pattern is not entirely searched, then an adjacent portion of the presently selected portion of the bit pattern is selected in step 640 and the step 625 is repeated.

In step 630, if the matching bit sequence is identified, then it is determined whether the identified sequence matches the received search parameters in step 645. For example, the processor 110 may determine whether the identified sequence is the Nth occurrence of the desired bit sequence, where N is specified by the search parameter. If the identified sequence does not match the received search parameters, then the step 635 is repeated. If the identified sequence matches the received search parameters, then in step 650, a location of the identified matching bit sequence is stored in a data storage device.

As shown in FIG. 7, the method 700 begins when a desired bit sequence is received in step 705. In step 710, a portion of the stored waveform is selected. Next, the selected portion of the waveform is, in step 715, converted into a bit sequence with binary values. For example, the waveform portion displayed in the acquisition window 250 may be selected, and the waveform portion can be converted into the bit sequence [0 1 1 1 1 0 1 0 1 0 1 0 0 1].

In step 720, it is determined whether a partially matched bit sequence is stored. For example, a register or a status memory may be accessed to determine whether a partially matched bit sequence is stored. If a partially matched bit sequence is not stored, then a bit sequence matching the desired bit sequence in the converted bit sequence is identified in step 725. For example, the processor 110 can use the search methods described with reference to FIG. 2 to identify a bit sequence in the converted bit sequence. Next, it is determined in step 730 whether a complete matching bit sequence is identified. For example, a complete matching bit sequence is identified if a bit sequence in the converted bit sequence matches completely to the desired bit sequence.

If a partially matched bit sequence is stored, then in step 735, the partially matched sequence is combined to the converted bit sequence. In step 740, a bit sequence in the combined bit sequence is identified to match the desired bit sequence. After matching, the step 730 is repeated.

In the step 730, if a complete matching bit sequence is identified, then a location of the identified matching bit sequence is stored in a data storage device (e.g., the memory 115 or the NVM 120) in step 745. If a complete matching bit sequence is not identified, in step 750, it is then determined whether a partially matched bit sequence is identified at a boundary of the selected portion. For example, the processor 110 may identify that an end of the select portion is matching a beginning of the desired bit sequence or a beginning of the selected portion is matching an end of the desired bit sequence. In some cases, the partially matched bit sequence may be combined with adjacent portion of the waveform to match the desired bit sequence entirely.

If a partially matched bit sequence is not identified at a boundary of the selected portion, then it is determined, in step 755, whether the entire waveform has been searched. If the entire waveform has been searched, then the method 700 ends. If the waveform is not entirely searched, then an adjacent portion of the presently selected portion is selected in step 760 and the step 715 is repeated.

In step 750, if a partially matched bit sequence is identified at a boundary of the selected portion, then the partially matched bit sequence is stored in step 765. For example, the partially matched bit sequence may be stored in the memory 115. Next, the step 755 is repeated.

Although various embodiments have been described, further embodiments are possible. For example, some embodiments may be implemented with a stand-alone acquisition system, a digital storage oscilloscope, a protocol analyzer, or logic analyzer. Some implementations may include two or more channels to acquire multiple signals substantially simultaneously. For example, 2, 4, 8, 16, 32, 64, 128, or more signals may be acquired in a corresponding number of channels. A different bit sequence may be specified for each channel. Multiple channels may be sent for display, for example, such that each channel displays the corresponding waveform at a different user-specified location (e.g., offset) relative to the location of the bit sequence for that channel.

In some examples, a bit sequence specified for one of the channels may be based off of one or more other channels. For example, the bit sequence specified for channel 2 may be determined to be a function of bits at specified offsets relative to the location of the bit sequence for channel 1. In another example, the bit sequence specified for channel 4 may be calculated from information (e.g., bytes, words, dwords, etc.) decoded from bits at user-specified locations relative to the bit sequences specified for channels 1-3.

In some embodiments, waveform data may be acquired using coherent sampling techniques, for example, by sampling and digitizing samples of at least N full patterns of the input waveform. The acquired waveform data may be sent for display, communicated remotely, and/or processed. In some implementations, the phase of the specified bit sequences in the data pattern may be compared, for example, to the phase of the acquisition system clock. This information may be used, for example, to serve the data points of the data pattern at their proper phase. In some examples, the data points may be served for additional post-processing, or for display on a display device.

In an illustrative embodiment, the DO 105 may acquire a long, repeating serial-data waveforms without using an external (e.g., hardware) pattern trigger by using a coherent sampling method such as CIS. In such an embodiment, the CIS time base may derive the sampling gate by phase-locking to a clock signal, which may advantageously allow high sampling rates and precise tracking of the signal bit rate in some embodiments. The coherent nature of the sampling gate allows the system to lock to the data pattern based on information that identifies the pattern length. In some embodiments, the CIS mode may be used to measure and process the resulting waveform as if the waveform were acquired in real time. Some examples of coherent sampling techniques are described in U.S. Pat. No. 6,271,773, entitled "Coherent sampling method and apparatus" by Kobyashi, and in U.S. Pat. Publ. 2006/0177018, entitled "Coherent Interleaved Sampling" by Kobyashi, et al., the disclosures and figures of which are incorporated herein by reference.

In an illustrative example, the relative phase between the specified bit pattern and the CIS time base hardware may be determined once upon initialization of the CIS time base hardware. Subsequent to the initialization, the relative phase compensation may be re-used for the duration of the session, or until another initialization is performed. Accordingly, various embodiments may operate to view and analyze a dataset in the same part of the pattern for different sessions and/or cases.

In an illustrative embodiment, a sampling oscilloscope may receive a trigger pattern that may advantageously used to measure pattern-dependent jitter. For example, jitter may be measured with respect to a user-specified edge within a pattern. Jitter measurements may be made on a selected portion of the full pattern that is acquired using coherent sampling methods.

In some embodiments, a processor may execute instructions that cause the processor to perform operations to isolate a predetermined bit pattern within a CIS acquired bit sequence representing a repeating pattern signal. In some examples, the location of the predetermined bit pattern is used to roll (or rotate) the acquired sequence to align to the predetermined bit pattern. The alignment may be stored in a data store, such as a video or display buffer for subsequent display on a display device. The alignment may be stored for further signal analysis, such as jitter measurement, for example.

Some examples may also decode a pattern that is encoded in a received data stream. A bit stream decoder (e.g., similar to a 1-bit A-to-D converter implemented in software) may determine the presence and/or content of a pattern in the data stream. If a pattern is identified, it may be compared to a reference pattern, which may be stored in a data store, such as a PRBS or other repeating pattern (e.g., K28.5). The information about phase of the identified pattern relative to the reference pattern may be output on a processor port, for example, as a time signal. In an example, such a time value signal may be supplied to a resynchronization processor that is configured to serve (e.g., to its client processors) data with corrected phase information. Such corrected phase information may, in some embodiments, comprise phase modulo pattern length information. In an example, a first processor may determine the desired time delay, and a second processor may rotate the output to the desired time delay. In some embodiments, both functions may be performed by a single software processor.

Various embodiments may include aspects of a computer. The essential elements of a computer are a processor for executing instructions and one or more memories for storing instructions and data. Suitable processors for the execution of a program of instructions include, by way of example, both general and special purpose microprocessors, which may include a single processor, or multiple processors in combination, and may further comprise one or more software processors running on a hardware platform. The processor and the memory can be supplemented by, or incorporated in, ASICs (application-specific integrated circuits). Generally, a processor will receive instructions and data from a data store, such as a read-only memory (ROM), a random access memory (RAM), or both.

Generally, a computer will also include, or be operatively coupled to communicate with, one or more mass storage devices for storing data files. Storage devices suitable for tangibly embodying computer program instructions and data may include volatile and/or non-volatile memory (NVM), which may include, but is not limited to, semiconductor memory devices (e.g., RAM, EPROM, EEPROM, NAND flash, NOR flash, thumb drives), magnetic disks (e.g., hard disc drives), magneto-optical and/or optical media (e.g., CD, DVD).

In some implementations, one or more user-interface features may be custom configured to perform specific functions. Various embodiments may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse, stylus, or a trackball by which the user can provide input to the computer.

In various embodiments, systems, such as the system 100, may communicate using suitable communication methods, equipment, and techniques. For example, the system 100 may communicate with a portable computer, network server, or other device using point-to-point communication in which a message is transported directly from the source to the receiver over a dedicated physical link (e.g., fiber optic link, point-to-point wiring, and daisy-chain). Other embodiments may transport messages by broadcasting to all or substantially all devices that are coupled together by a communication network, for example, by using omni-directional radio frequency (RF) signals, while still other embodiments may transport messages characterized by high directivity, such as RF signals transmitted using directional (i.e., narrow beam) antennas or infrared signals that may optionally be used with focusing optics. Still other embodiments are possible using appropriate interfaces and protocols such as, by way of example and not intended to be limiting, RS-232, RS-422, RS-485, 802.11a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In some embodiments, each memory may be programmed with the same information and be initialized with substantially identical information stored in non-volatile memory. In other embodiments, one or more systems 100 may be custom configured to perform specific functions. For example, one system 100 may be calibrated for use to identify intrinsic jitter during production of other systems.

A number of implementations of the invention have been described. Nevertheless, it will be understood that various modifications may be made without departing from the spirit and scope of the invention. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. A method to process a signal with repeating information having a time period of repetition, the method comprising the steps of:
    receiving a synchronizing signal having a frequency substantially equal to or sub-harmonically related to a bit rate of the signal being processed and substantially synchronous with a bit phase of the signal being processed;
    synchronizing a phase-locked loop to the synchronizing signal;
    sampling the signal being processed over multiple periods of the repeating information to produce a sampled waveform, the sampling being performed in accordance with the synchronizing signal;
    post-processing the sampled waveform to form a coherently sampled waveform representing one period of the repeating information; identifying a location within the coherently sampled waveform at which a portion thereof matches a desired binary sequence;
    synchronizing, though rotation of the coherently sampled waveform, so that the identified location is positioned at a location representative of a predetermined time within the time period of repetition; and
    measuring pattern dependent jitter in accordance with the synchronized portions of the formed coherently sampled waveform.

2. The method of claim 1, further comprising displaying at least a portion of the synchronized coherently sampled waveform.

3. The method of claim 1, further comprising storing in a data store information about the identified location.

4. The method of claim 1, further comprising selecting a portion of the synchronized coherently sampled waveform based on the identified location.

5. The method of claim 4, further comprising displaying on a display device the selected portion of the synchronized coherently sampled waveform.

6. The method of claim 1, wherein processing the waveform comprises digitizing the sampled waveform.

7. The method of claim 1, wherein the sampled waveform is processed using information about the length of the time period of repetition.

8. The method of claim 1, wherein the desired binary sequence comprises at least one don't care bit.

9. The method of claim 1, wherein the waveform being processed comprises a pseudo-random binary sequence (PRBS).

10. A method to process a signal with repeating information having a time period of repetition, the method comprising the steps of:
    receiving a synchronizing signal having a frequency substantially equal to or sub-harmonically related to a bit rate of the signal being processed and substantially synchronous with a bit phase of the signal being processed;
    synchronizing a phase-locked loop to the synchronizing signal;
    sampling the signal being processed over multiple periods of the repeating information to produce a sampled waveform, the sampling being performed in accordance with the synchronizing signal:,
    post-processing the sampled waveform to form a coherently sampled waveform representing one period of the repeating information; identifying a location within the coherently sampled waveform at which a portion thereof matches a desired binary sequence;
    synchronizing, though rotation of the coherently sampled waveform, so that the identified location is positioned at a location representative of a predetermined time within the time period of repetition; and
    displaying at least a portion of the coherently sampled waveform relative to the synchronized portions of the desired binary sequence.

11. The method of claim 10, further comprising the step of measuring pattern dependent jitter based on the synchronized portions of the formed coherently sampled waveform.

12. A waveform processing system comprising:
    an acquisition module to acquire samples of an input signal for a plurality of periods of a repeating binary pattern in the input signal, the acquisition being performed in accordance with a synchronizing signal having a frequency substantially equal to or sub-harmonically related to a bit rate of the input signal and substantially synchronous with a bit phase of the input signal;
    a processor operatively coupled to post-process data representing the acquired samples; and
    a memory containing instructions that, when executed by the processor, cause operations to be performed, the operations comprising:
    synchronizing a phase-locked loop to the synchronizing signal;
    sampling the input signal over multiple periods of the repeating binary pattern to produce a sampled waveform, the sampling being performed in accordance with the synchronizing signal;
    processing the sampled waveform to form a coherently sampled waveform representing one period of the repeating binary pattern;
    identifying a location within the sampled waveform at which a portion thereof matches a desired binary sequence;
    synchronizing, though rotation of the sampled waveform, so that the identified location is positioned at a location representative of a predetermined time within the time spanned by a single repetition of the repeating binary pattern; and
    performing at least one of the following two operations: (1) measuring pattern dependent jitter based on the synchronized portions of the formed binary pattern; and, (2) displaying at least a portion of the sampled waveform relative to the synchronized portions of the binary pattern.

13. The system of claim 12, further comprising selecting a portion of the formed binary sequence in accordance with the identified location.

14. The system of claim 12, further comprising a digital storage oscilloscope that includes the acquisition module.

* * * * *